US012665621B2

(12) United States Patent
Ponton et al.

(10) Patent No.: US 12,665,621 B2
(45) Date of Patent: Jun. 23, 2026

(54) RADIO TRANSMITTER

(71) Applicant: Cypress Semiconductor Corporation, San Jose, CA (US)

(72) Inventors: Davide Ponton, Villach (AT); Ibrahim Petricli, Pavia (IT); Nicolo Zilio, Villach (AT); David Seebacher, Villach (AT); Joo Tham, Sunnyvale, CA (US); Giuseppe Li Puma, Bochum (DE); Mustafa Altintas, Mission Viejo, CA (US); Philip Neaves, Troston (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 311 days.

(21) Appl. No.: 18/484,242

(22) Filed: Oct. 10, 2023

(65) Prior Publication Data

US 2025/0119166 A1     Apr. 10, 2025

(51) Int. Cl.
| | |
|---|---|
| *H04B 1/00* | (2006.01) |
| *H03F 3/21* | (2006.01) |
| *H04B 1/44* | (2006.01) |

(52) U.S. Cl.
CPC ............. *H04B 1/0078* (2013.01); *H03F 3/21* (2013.01); *H04B 1/44* (2013.01)

(58) Field of Classification Search
CPC .... H04B 1/40; H04B 2001/0408; H04B 1/44; H04B 1/0475; H04B 5/79; H04B 1/0053; H04B 1/48; H04B 1/54; H04B 10/07955; H04B 10/0799; H04B 10/69; H04B 3/50; H04B 1/0458; H04B 1/0483
USPC ....................................................... 455/552.1
See application file for complete search history.

(56) References Cited

U.S. PATENT DOCUMENTS

| | | | |
|---|---|---|---|
| 2017/0026136 A1* | 1/2017 | Thompson | .............. H04B 1/525 |
| 2025/0070729 A1* | 2/2025 | Lee | ......................... H03F 3/211 |

* cited by examiner

*Primary Examiner* — Ajibola A Akinyemi

(57) ABSTRACT

A transmitter has a port configured to receive a transmit signal, a first power amplifier connected to the port, a second power amplifier connected to the port, a power supply switch configured to selectively couple one of a first supply voltage terminal or a second supply voltage terminal to one of a supply terminal of the first power amplifier or a supply terminal of the second power amplifier, a first antenna output terminal connected to the first power amplifier, a second antenna output terminal connected to the second power amplifier, and a control unit configured to control the power supply switch based on a transmitter power requirement to provide an amplified transmit signal based on the transmit signal at one of the first antenna output terminal or the second antenna output terminal.

18 Claims, 5 Drawing Sheets

Figure 5:
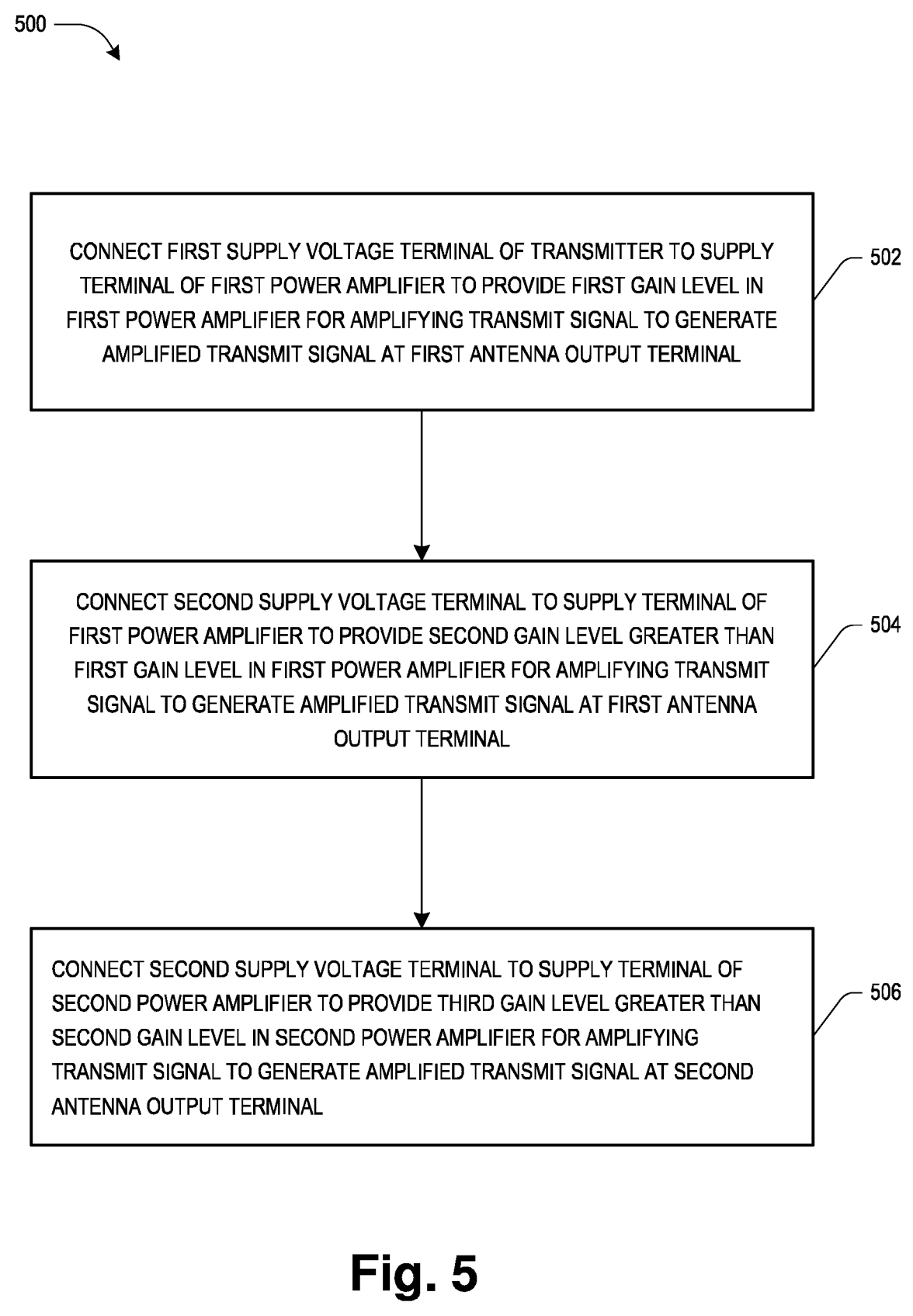

500 —

CONNECT FIRST SUPPLY VOLTAGE TERMINAL OF TRANSMITTER TO SUPPLY TERMINAL OF FIRST POWER AMPLIFIER TO PROVIDE FIRST GAIN LEVEL IN FIRST POWER AMPLIFIER FOR AMPLIFYING TRANSMIT SIGNAL TO GENERATE AMPLIFIED TRANSMIT SIGNAL AT FIRST ANTENNA OUTPUT TERMINAL

502

CONNECT SECOND SUPPLY VOLTAGE TERMINAL TO SUPPLY TERMINAL OF FIRST POWER AMPLIFIER TO PROVIDE SECOND GAIN LEVEL GREATER THAN FIRST GAIN LEVEL IN FIRST POWER AMPLIFIER FOR AMPLIFYING TRANSMIT SIGNAL TO GENERATE AMPLIFIED TRANSMIT SIGNAL AT FIRST ANTENNA OUTPUT TERMINAL

504

CONNECT SECOND SUPPLY VOLTAGE TERMINAL TO SUPPLY TERMINAL OF SECOND POWER AMPLIFIER TO PROVIDE THIRD GAIN LEVEL GREATER THAN SECOND GAIN LEVEL IN SECOND POWER AMPLIFIER FOR AMPLIFYING TRANSMIT SIGNAL TO GENERATE AMPLIFIED TRANSMIT SIGNAL AT SECOND ANTENNA OUTPUT TERMINAL

RADIO TRANSMITTER

TECHNICAL FIELD

The present disclosure relates to the field of communications, and more particularly to a transmitter for a radio.

BACKGROUND

Low power networked devices, such as Internet of Things (IoT) devices require energy efficiency. The vast networks of battery-operated low-power IoT devices are constrained by their battery usage. Battery operated transmitters trade off range and battery life.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a transmitter comprises a port configured to receive a transmit signal, a first power amplifier connected to the port, a second power amplifier connected to the port, a power supply switch configured to selectively couple one of a first supply voltage terminal or a second supply voltage terminal to one of a supply terminal of the first power amplifier or a supply terminal of the second power amplifier, a first antenna output terminal connected to the first power amplifier, a second antenna output terminal connected to the second power amplifier, and a control unit configured to control the power supply switch based on a transmitter power requirement to provide an amplified transmit signal based on the transmit signal at one of the first antenna output terminal or the second antenna output terminal.

In an embodiment, a radio comprises an antenna port, a modulator configured to generate a transmit signal, a transmit-receive switch connected to the antenna port, a receiver connected to the transmit-receive switch, a transmitter connected to the transmit-receive switch and comprises a first power amplifier connected to the modulator, a second power amplifier connected to the modulator, a power supply switch configured to selectively couple one of a first supply voltage terminal or a second supply voltage terminal to one of a supply terminal of the first power amplifier or a supply terminal of the second power amplifier, a control unit configured to control the power supply switch based on a transmitter power requirement, a first antenna output terminal connected to the first power amplifier, and a second antenna output terminal connected to the second power amplifier, and a processor configured to control the transmit-receive switch to toggle between a transmit mode, wherein the transmitter is connected to the antenna port, and a receive mode, wherein the receiver is connected to the antenna port.

In an embodiment, a system comprises means for connecting a first supply voltage terminal of a transmitter to a supply terminal of a first power amplifier to provide a first gain level in the first power amplifier for amplifying a transmit signal to generate an amplified transmit signal at a first antenna output terminal, means for connecting a second supply voltage terminal of the transmitter to the supply terminal of the first power amplifier to provide a second gain level greater than the first gain level in the first power amplifier for amplifying the transmit signal to generate the amplified transmit signal at the first antenna output terminal, and means for connecting the second supply voltage terminal to a supply terminal of a second power amplifier to provide a third gain level greater than the second gain level in the second power amplifier for amplifying the transmit signal to generate the amplified transmit signal at a second antenna output terminal.

In an embodiment, a method comprises connecting a first supply voltage terminal of a transmitter to a supply terminal of a first power amplifier to provide a first gain level in the first power amplifier for amplifying a transmit signal to generate an amplified transmit signal at a first antenna output terminal, connecting a second supply voltage terminal of the transmitter to the supply terminal of the first power amplifier to provide a second gain level greater than the first gain level in the first power amplifier for amplifying the transmit signal to generate the amplified transmit signal at the first antenna output terminal, and connecting the second supply voltage terminal to a supply terminal of a second power amplifier to provide a third gain level greater than the second gain level in the second power amplifier for amplifying the transmit signal to generate the amplified transmit signal at a second antenna output terminal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 5 is an illustration of an example method for controlling gain in an amplifier, according to some embodiments.

DETAILED DESCRIPTION

Figures 1, 2:
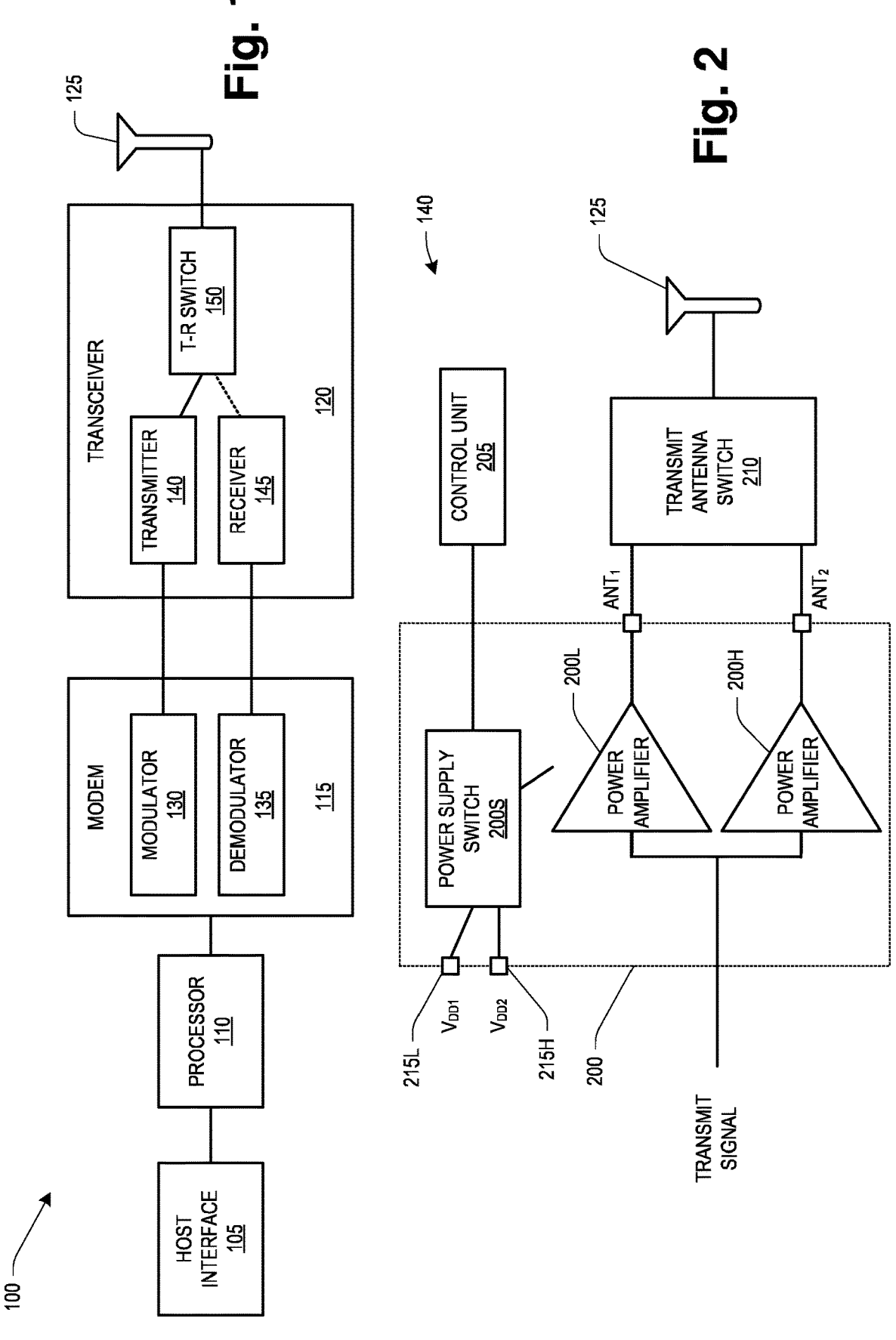
FIG. 1 is a component block diagram of a radio, according to some embodiments.
FIG. 2 is a component block diagram illustrating a transmitter, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

In some embodiments, a transmitter comprises a multiple gain power amplifier. A power supply switch allows different supply voltages to be provided to one or more power amplifiers to provide different gain levels. The power amplifiers and power supply switch may be integrated onto a single semiconductor die, providing a reduced footprint and cost.

FIG. 1 is a simplified block diagram of a radio 100, according to some embodiments. The radio 100 may support one or more communication protocols, such as a Bluetooth (BT), Bluetooth Low Energy (BLE), Wi-Fi, or some other communication protocol. is the radio comprises a host interface 105, a processor 110, a modem 115, a transceiver 120, and an antenna 125. The radio 100 may communicate with other devices, such as a host computer, using the host interface 105. The modem 115 comprises a modulator 130 and a demodulator 135. The transceiver 120 comprises includes a transmitter 140, a receiver 145, and a transmit-receive (T-R) switch 150. The T-R switch 150 is connected to the antenna 125 at an antenna port 155. The transmitter 140 is configured to transmit signals provided by the modulator 130 and the receiver 145 receives modulated signals and provide the modulated signals to demodulator 135 in the modem 115 for processing. Additionally, the radio 100 may further include a number of band pass filters, amplifiers, multiplexers, demultiplexers, converters, error correction units, analog-to-digital converters (ADCs), digital-to-analog converters (DACs), or other circuits within and through which signals are passed between the antenna 125 and components of the communication system.

The processor 110 implements a software or firmware application that controls communication by the radio 100. The processor 110 includes one or multiple processors, microprocessors, data processors, co-processors, application specific integrated circuits (ASICs), controllers, programmable logic devices, chipsets, field-programmable gate arrays (FPGAs), application specific instruction-set processors (ASIPs), system-on-chips (SoCs), central processing units (CPUs) (e.g., one or multiple cores), microcontrollers, and/or some other type of component that interprets and/or executes instructions and/or data. The processor 110 may be implemented as hardware (e.g., a microprocessor, etc.) or a combination of hardware and software (e.g., a SoC, an ASIC, etc.) and may include one or multiple memories (e.g., cache, random access memory (RAM), dynamic random access memory (DRAM), cache, read only memory (ROM), a programmable read only memory (PROM), a static random access memory (SRAM), a single in-line memory module (SIMM), a dual in-line memory module (DIMM), a flash memory, and/or some other suitable type of memory).

In one embodiment, components of the host interface 105, the processor 110, the modem 115, and the transceiver 120 are integrally formed or incorporated on a single integrated circuit (IC) chip. The antenna 125 can also be integrally formed on the same IC chip, or on a separate chip or substrate packaged in a single multi-chip IC package with the IC chip including the host interface 105, the processor 110, the modem 115, and the transceiver 120. Alternatively, the antenna 125, as well as other components of the radio 100 can be separately implemented on a printed circuit board (PCB) to which the IC chip including the host interface 105, the processor 110, the modem 115, and the transceiver 120 are mounted or attached.

The processor 110 controls the T-R switch 150 to toggle between transmit and receive modes such that the transmitter 140 is connected to the antenna 125 during a transmit mode and the receiver 145 is connected to the antenna 125 during a receive mode. The radio 100 may include fewer components, additional components, different components, and/or a different arrangement of components than those illustrated in FIG. 1.

FIG. 2 is a component block diagram illustrating the transmitter 140, according to some embodiments. In some embodiments, the transmitter 140 comprises a multiple gain power amplifier 200, a control unit 205, and a transmit antenna switch 210. The transmit antenna switch 210 is connected to antenna terminals $ANT_1$, $ANT_2$ of the power amplifier 200.

The modulator 130 generates a transmit signal, such as a radio signal encoded with data. For example, the processor 110 may generate or receive data to be transmitted by the radio 100. The processor 110 may provide data to the modem 115, which processes the data in the modulator 130 to generate a transmit signal according to the communication protocol being implemented by the radio 100 to be transmitted using the antenna 125.

In some embodiments, the multiple gain power amplifier 200 comprises a low gain power amplifier 200L, a high gain power amplifier 200H, and a power supply switch 200S. The power supply switch 200S selectively connect either a low supply voltage, $V_{DD1}$, at a low voltage supply terminal 215H or a high supply voltage, $V_{DD2}$, at a low voltage supply terminal 215L to the power amplifiers 200L, 200H depending on the gain requirements for the transmitter 140. In some embodiments, the low gain power amplifier 200L is enabled using the low supply voltage for low gain applications, such as 0 dB or 4 dB, the low gain power amplifier 200L is enabled using the high supply voltage for medium gain applications, such as 13 dB, and high gain power amplifier 200H is enabled using the high supply voltage for high gain applications, such as 20 dB. The control unit 205 controls the power supply switch 200S to connect the appropriate supply voltage terminal 215L, 215H to the appropriate power amplifier 200L, 200H depending on the required gain for the transmitter 140. Other structures and/or configurations of the multiple gain power amplifier 200 are within the scope of the present disclosure. For example, the number of power amplifiers and the supply voltages may vary.

Figure 3:
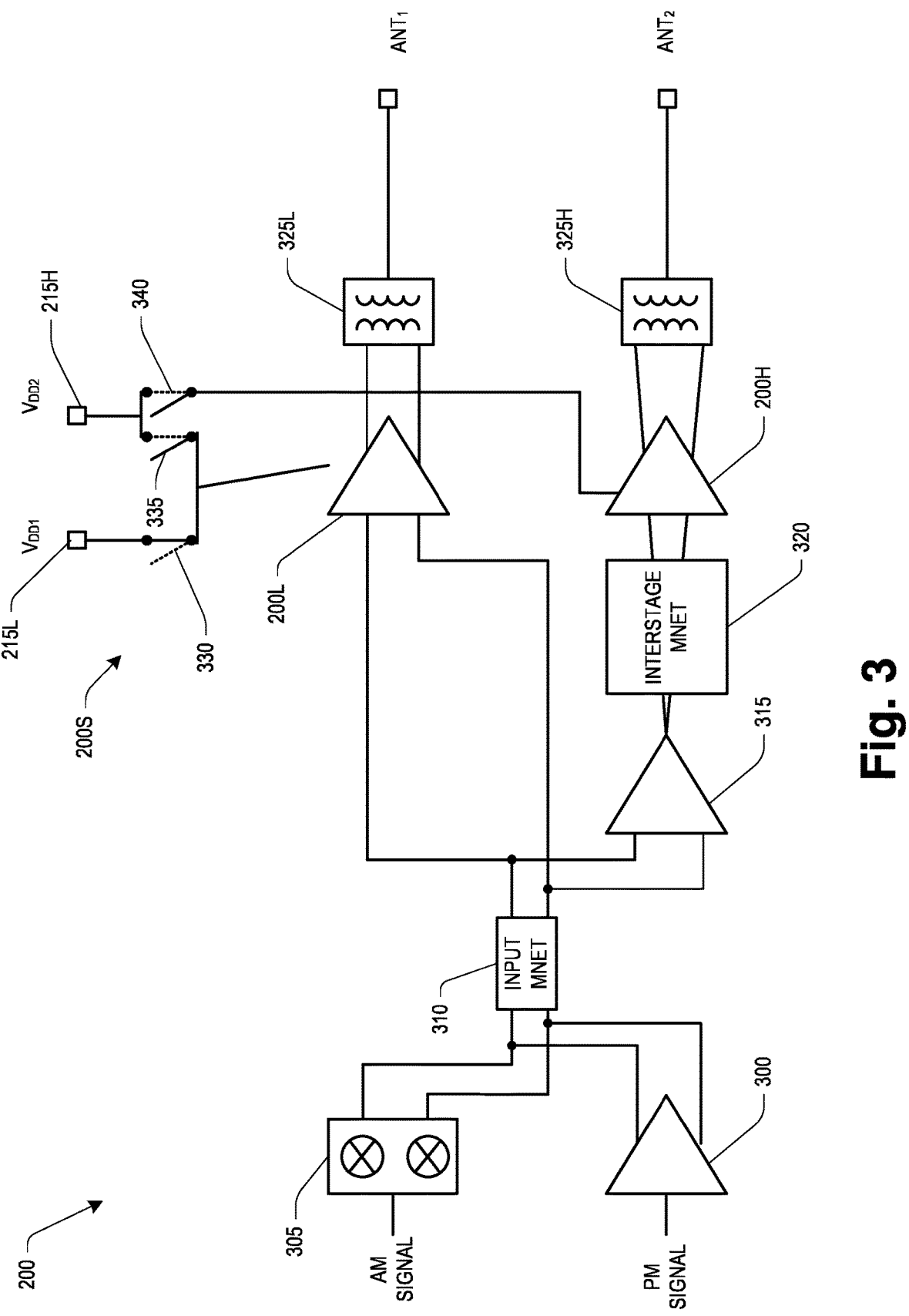
FIG. 3 is a diagram of an integrated multiple gain power amplifier, according to some embodiments.

FIG. 3 is a diagram of the integrated multiple gain power amplifier 200, according to some embodiments. A transmit signal is received from the modulator 130 at an amplifier driver 300 in the case of a frequency modulated signal or at a mixer 305 in the case of an amplitude modulated signal, such as a signal including an in-phase component and a quadrature component. An input matching network 310 is connected to the amplifier driver 300 and the mixer 305 for impedance matching. The input matching network 310 is connected to the low gain power amplifier 200L and the high gain power amplifier 200H to facilitate amplification of the transmit signal.

In some embodiments, an amplifier driver 315 and an interstage matching network 320 are connected between the input matching network 310 and the high gain power amplifier 200H to provide additional amplification and impedance matching. Output matching networks 325L, 35H are provided on the outputs of the power amplifiers 200L, 200H to provide impedance matching and to convert the differential signals from the power amplifiers 200L, 200H to single-ended signals. The output matching network 325L is connected to the antenna terminal $ANT_1$, and the output matching network 325H is connected to the antenna terminal $ANT_2$.

The power supply switch 200S comprises a first switch element 330 connected to the low voltage supply terminal 215L to connect the $V_{DD1}$ supply voltage to the supply terminal of the low gain power amplifier 200L, a second switch element 335 connected to the high voltage supply terminal 215H to provide the $V_{DD}$ supply voltage to the supply terminal of the low gain power amplifier 200L, and a third switch element 340 connected to the high voltage supply terminal 215H to provide the $V_{DD2}$ supply voltage to the supply terminal of the high gain power amplifier 200H.

The control unit 205 controls the power supply switch 200S to close the first switch element 330 in a low gain mode. In some embodiments, the low gain power amplifier 200L can provide a gain of about 0 dB or 4 dB with a supply voltage, $V_{DD1}$, of around 0.9V. The control unit 205 controls the power supply switch 200S to close the second switch element 335 in a medium gain mode. In some embodiments, the low gain power amplifier 200L can provide a gain of about 13 dB a supply voltage, $V_{DD1}$, of around 2.5V. The control unit 205 controls the power supply switch 200S to close the third switch element 340 in a high gain mode. In some embodiments, the high gain power amplifier 200L can provide a gain of about 20 dB with a supply voltage, $V_{DD2}$, of around 2.5V.

Figure 4:
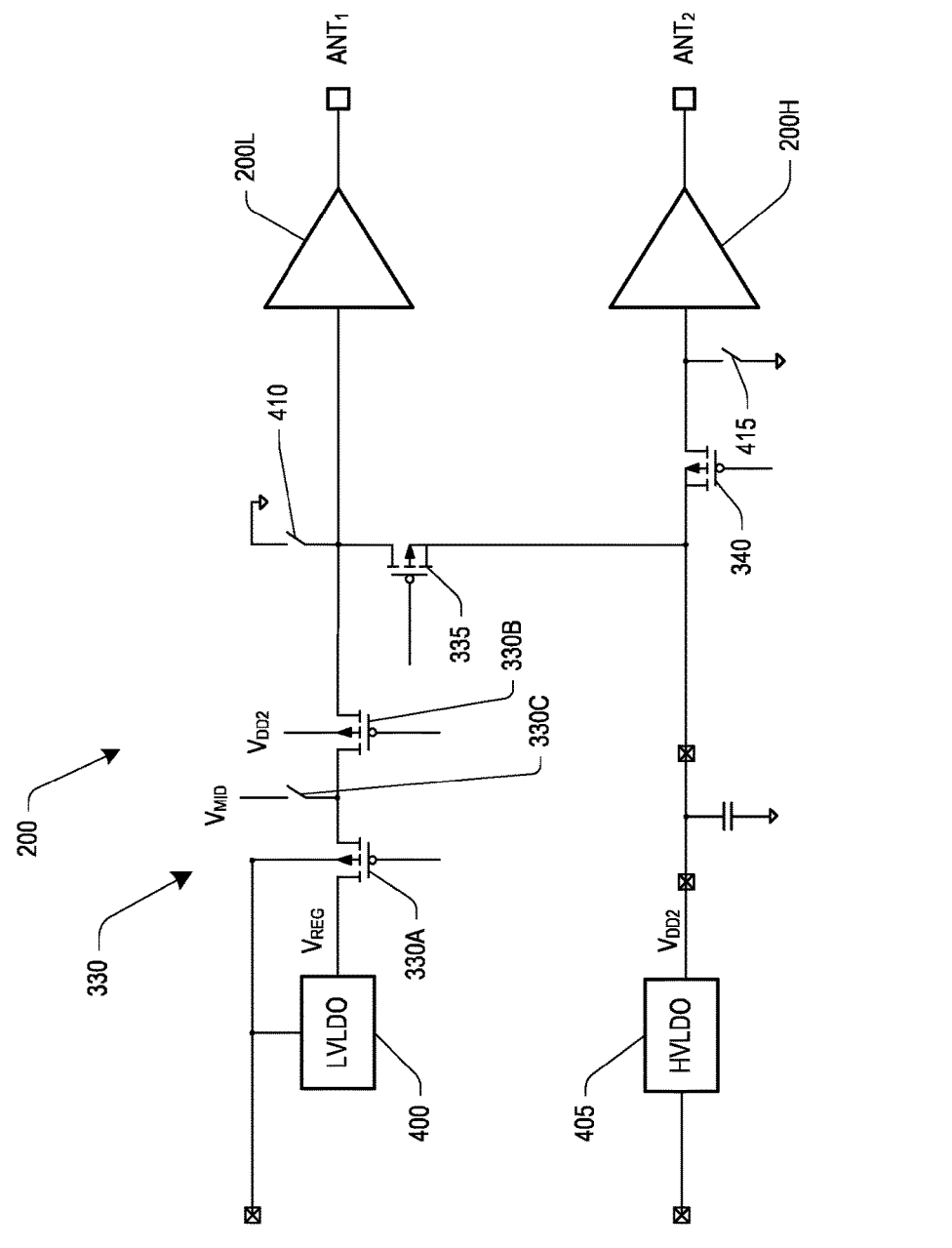
FIG. 4 is a diagram of a power supply switch, according to some embodiments.

FIG. 4 is a diagram of the power supply switch 200S, according to some embodiments. In some embodiments, the power supply switch 200S is integrated on the same semiconductor die as the transmitter 140. In some embodiments, a low voltage low drop out regulator (LVLDO) 400 and a high voltage low dropout regulator (HVLDO) 405 are connected to the power supply switch 200S to provide the supply voltages for the transmitter 140. The LVLDO 400 and the HVLOD 405 may be integrated onto the same semiconductor die as the power supply switch 200S or on a circuit board external to the power supply switch 200S. In some embodiments, the LVLDO 400 receives the first supply voltage, $V_{DD1}$, such as 1.0V and generates a regulated low supply voltage, $V_{REG}$, of about 0.9V based on the first supply voltage. In some embodiments, the HVLDO 405 receives a second external supply voltage, such as from a battery, $V_{BAT}$, and generates the second supply voltage, $V_{DD2}$.

In some embodiments, the first switch element 330 comprises a low voltage switch 330A, a high voltage switch 330B, and a simple switch 330C. The low voltage switch 330A and the high voltage switch 330B may comprise p-type transistor devices. The simple switch 330C may comprise a p-type transistor device or an n-type transistor device. The low voltage switch 330A and the simple switch may have a configuration suitable for a voltage of about 1.0V and the high voltage switch 330B may have a configuration suitable for a voltage of about 2.5V. For example, the low voltage switch 330A and the high voltage switch 330B may each support a maximum voltage stress on their terminals suitable for the voltage domain. The low voltage switch 330A receives the regulated low supply voltage, $V_{REG}$, and the high voltage switch 330B provides the regulated low supply voltage, $V_{REG}$, to the power amplifier 200L. In this arrangement, the low voltage switch 330A connects the power amplifier 200L to the first supply voltage, $V_{DD1}$, through the LVLDO 400.

The high voltage switch 330B isolates the low voltage switch 330A from the high voltage domain present when the second switch element 335 is closed to provide the high supply voltage, $V_{DD2}$, to the power amplifier 200L. The simple switch 330C is connected between a voltage supply, $V_{MID}$, and a node between the low voltage switch 330A and the high voltage switch 330B to provide protection for the low voltage switch 330A when the low voltage switch 330A is off (i.e., open}. The voltage supply, $V_{MID}$, may be a voltage supply received from an external source or generated on the semiconductor die including the power supply switch 200S. When the first switch element 330 is closed, the low voltage switch 330A and the high voltage switch 330B are closed and the simple switch 330C is open. When the first switch element 330 is open, the low voltage switch 330A and the high voltage switch 330B are open and the simple switch 330C is closed.

In some embodiments, the power supply switch 200S comprises a simple switch 410 that grounds the input of the power amplifier 200L when the third switch element 340 is closed to provide the high supply voltage, $V_{DD2}$, to the power amplifier 200H. A simple switch 415 grounds the input of the power amplifier 200H when the first switch element 330 is closed to provide the regulated low supply voltage, $V_{REG}$, to the power amplifier 200L or the second switch element 335 is closed to provide the high supply voltage, $V_{DD2}$, to the power amplifier 200L.

FIG. 5 is an illustration of an example method 500 for controlling gain in an amplifier, according to some embodiments. At 502, a first supply voltage terminal of a transmitter 140 is connected to a supply terminal of a first power amplifier 200L to provide a first gain level in the first power amplifier 200L for amplifying a transmit signal to generate an amplified transmit signal at a first antenna output terminal. At 504, a second supply voltage terminal is connected to the supply terminal of the first power amplifier 200L to provide a second gain level greater than the first gain level in the first power amplifier 200L for amplifying the transmit signal to generate the amplified transmit signal at the first antenna output terminal. At 506, the second supply voltage terminal is connected to a supply terminal of a second power amplifier 200H to provide a third gain level greater than the second gain level in the second power amplifier 200H for amplifying the transmit signal to generate the amplified transmit signal at a second antenna output terminal.

Figure 6:
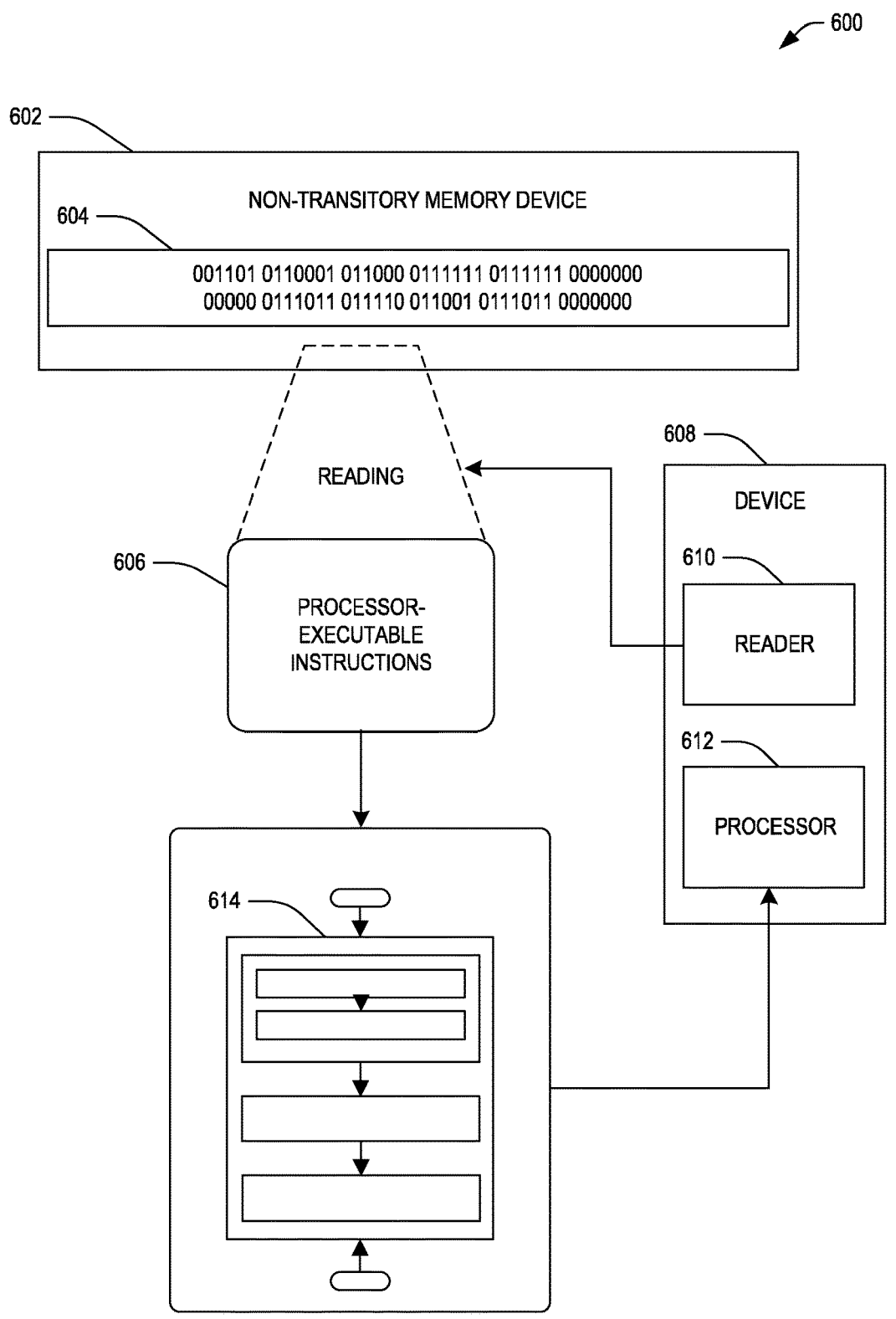
FIG. 6 illustrates an exemplary embodiment of a computer-readable medium, according to some embodiments.

FIG. 6 illustrates an exemplary embodiment 600 of a computer-readable medium 602, according to some embodiments. One or more embodiments involve a computer-readable medium comprising processor-executable instructions configured to implement one or more of the techniques presented herein. The embodiment 600 comprises a non-transitory computer-readable medium 602 (e.g., a CD-R, DVD-R, flash drive, a platter of a hard disk drive, etc.), on which is encoded computer-readable data 604. This computer-readable data 604 in turn comprises a set of processor-executable computer instructions 606 that, when executed by a computing device 608 including a reader 610 for reading the processor-executable computer instructions 606 and a processor 612 for executing the processor-executable computer instructions 606, are configured to facilitate operations according to one or more of the principles set forth herein. In some embodiments, the processor-executable computer instructions 606, when executed, are configured to facilitate performance of a method 614, such as at least some of the aforementioned method(s). In some embodiments, the processor-executable computer instructions 606, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

In an embodiment, a transmitter comprises a port configured to receive a transmit signal, a first power amplifier connected to the port, a second power amplifier connected to the port, a power supply switch configured to selectively couple one of a first supply voltage terminal or a second supply voltage terminal to one of a supply terminal of the first power amplifier or a supply terminal of the second power amplifier, a first antenna output terminal connected to the first power amplifier, a second antenna output terminal connected to the second power amplifier, and a control unit configured to control the power supply switch based on a transmitter power requirement to provide an amplified transmit signal based on the transmit signal at one of the first antenna output terminal or the second antenna output terminal.

In an embodiment, the control unit is configured to control the power supply switch to connect the first supply voltage terminal to the supply terminal of the first power amplifier to provide a first gain level in the first power amplifier for amplifying the transmit signal to generate the amplified transmit signal at the first antenna output terminal, connect the second supply voltage terminal to the supply terminal of the first power amplifier to provide a second gain level greater than the first gain level in the first power amplifier for amplifying the transmit signal to generate the amplified transmit signal at the first antenna output terminal, and connect the second supply voltage terminal to the supply terminal of the second power amplifier to provide a third gain level greater than the second gain level in the second power amplifier for amplifying the transmit signal to generate the amplified transmit signal at the second antenna output terminal.

In an embodiment, the power supply switch comprises a first switch element connected between the first supply voltage terminal and the supply terminal of the first power amplifier, a second switch element connected between the second supply voltage terminal and the supply terminal of the first power amplifier, and a third switch element connected between the second supply voltage terminal and the supply terminal of the second power amplifier.

In an embodiment, the control unit is configured to close the first switch element to provide a first gain level in the first power amplifier for amplifying the transmit signal to generate the amplified transmit signal at the first antenna output terminal, close the second switch element to provide a second gain level greater than the first gain level in the first power amplifier for amplifying the transmit signal to generate the amplified transmit signal at the first antenna output terminal, and close the third switch element to provide a third gain level greater than the second level in the second power amplifier for amplifying the transmit signal to generate the amplified transmit signal at the second antenna output terminal.

In an embodiment, the control unit is configured to connect the first supply voltage terminal to the supply terminal of the first power amplifier to provide one of a first gain level or a second gain level greater than the first gain level in the first power amplifier for amplifying the transmit signal to generate the amplified transmit signal at the first antenna output terminal.

In an embodiment, the transmitter comprises a mixer connected to the port, and an input matching network having a first input connected to the mixer and an output connected to the first power amplifier and the second power amplifier.

In an embodiment, the transmitter comprises a first driver connected to the port, and an input matching network having a first input connected to the first driver and an output connected to the first power amplifier and the second power amplifier.

In an embodiment, the transmitter comprises a second driver connected to the input matching network, and an interstage matching network having an input connected to the second driver and an output connected to the second power amplifier.

In an embodiment, the transmitter comprises an output matching network connected to at least one of the first power amplifier or the second power amplifier, wherein the output matching network is configured to receive a differential input signal and generate the amplified transmit signal as a single-ended output signal.

In an embodiment, the power supply switch comprises a first switch connected to the first supply voltage terminal, a second switch connected to the first switch at a node and connected to the supply terminal of the first power amplifier, and a third switch connected to the first supply voltage terminal and the node, wherein the first supply voltage terminal is connected to a body terminal of the first switch, the second supply voltage terminal is connected to a body terminal of the second switch, and the control unit is configured to close the third switch when the first switch is open and the second switch is closed.

In an embodiment, the power supply switch comprises a fourth switch connected to the second supply voltage terminal and the supply terminal of the first power amplifier, and a fifth switch connected to the second supply voltage terminal and the supply terminal of the second power amplifier.

In an embodiment, a radio comprises an antenna port, a modulator configured to generate a transmit signal, a transmit-receive switch connected to the antenna port, a receiver connected to the transmit-receive switch, a transmitter connected to the transmit-receive switch and comprises a first power amplifier connected to the modulator, a second power amplifier connected to the modulator, a power supply switch configured to selectively couple one of a first supply voltage terminal or a second supply voltage terminal to one of a supply terminal of the first power amplifier or a supply terminal of the second power amplifier, a control unit configured to control the power supply switch based on a transmitter power requirement, a first antenna output terminal connected to the first power amplifier, and a second antenna output terminal connected to the second power amplifier, and a processor configured to control the transmit-receive switch to toggle between a transmit mode, wherein the transmitter is connected to the antenna port, and a receive mode, wherein the receiver is connected to the antenna port.

In an embodiment, the control unit is configured to control the power supply switch to connect the first supply voltage terminal to the supply terminal of the first power amplifier to provide a first gain level in the first power amplifier for amplifying the transmit signal to generate an amplified transmit signal at the first antenna output terminal, connect the second supply voltage terminal to the supply terminal of the first power amplifier to provide a second gain level greater than the first gain level in the first power amplifier for amplifying the transmit signal to generate the amplified transmit signal at the first antenna output terminal, and connect the second supply voltage terminal to the supply terminal of the second power amplifier to provide a third gain level greater than the second gain level in the second power amplifier for amplifying the transmit signal to generate the amplified transmit signal at the second antenna output terminal.

In an embodiment, the power supply switch comprises a first switch element connected between the first supply voltage terminal and the supply terminal of the first power amplifier, a second switch element connected between the second supply voltage terminal and the supply terminal of the first power amplifier, and a third switch element connected between the second supply voltage terminal and the supply terminal of the second power amplifier.

In an embodiment, the control unit is configured to connect the first supply voltage terminal to the supply terminal of the first power amplifier to provide one of a first gain level or a second gain level greater than the first gain level in the first power amplifier for amplifying the transmit signal to generate an amplified transmit signal at the first antenna output terminal.

In an embodiment, the transmitter comprises a mixer connected to the modulator, a first driver connected to the modulator, and an input matching network having a first input connected to the mixer and the first driver and an output connected to the first power amplifier and the second power amplifier.

In an embodiment, the radio comprises a first driver connected to the modulator, an input matching network having a first input connected to the first driver and an output connected to the first power amplifier and the second power amplifier, a second driver connected to the input matching network, and an interstage matching network having an input connected to the second driver and an output connected to the second power amplifier.

In an embodiment, the power supply switch comprises a first switch connected to the first supply voltage terminal, a second switch connected to the first switch at a node and connected to the supply terminal of the first power amplifier, a third switch connected to the first supply voltage terminal and the node, a fourth switch connected to the second supply voltage terminal and the supply terminal of the first power amplifier, and a fifth switch connected to the second supply voltage terminal and the supply terminal of the second power amplifier, wherein the first supply voltage terminal is connected to a body terminal of the first switch, the second supply voltage terminal is connected to a body terminal of the second switch, and the control unit is configured to close the third switch when the first switch is open and the second switch is closed.

In an embodiment, a method comprises connecting a first supply voltage terminal of a transmitter to a supply terminal of a first power amplifier to provide a first gain level in the first power amplifier for amplifying a transmit signal to generate an amplified transmit signal at a first antenna output terminal, connecting a second supply voltage terminal of the transmitter to the supply terminal of the first power amplifier to provide a second gain level greater than the first gain level in the first power amplifier for amplifying the transmit signal to generate the amplified transmit signal at the first antenna output terminal, and connecting the second supply voltage terminal to a supply terminal of a second power amplifier to provide a third gain level greater than the second gain level in the second power amplifier for amplifying the transmit signal to generate the amplified transmit signal at a second antenna output terminal.

In an embodiment, the method comprises providing a fourth gain level greater than the first gain level and less than the second gain level in the first power amplifier for amplifying the transmit signal to generate the amplified transmit signal at the first antenna output terminal.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" and/or the like is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A transmitter, comprising:
a port configured to receive a transmit signal;
a first power amplifier connected to the port;
a second power amplifier connected to the port;
a power supply switch configured to selectively couple one of a first supply voltage terminal or a second supply voltage terminal to one of a supply terminal of the first power amplifier or a supply terminal of the second power amplifier;
a first antenna output terminal connected to the first power amplifier;
a second antenna output terminal connected to the second power amplifier; and
a control unit configured to control the power supply switch based on a transmitter power requirement to provide an amplified transmit signal based on the transmit signal at one of the first antenna output terminal or the second antenna output terminal, wherein the control unit is configured to control the power supply switch to connect the first supply voltage terminal to the supply terminal of the first power amplifier to provide a first gain level in the first power amplifier for amplifying the transmit signal to generate the amplified transmit signal at the first antenna output terminal, connect the second supply voltage terminal to the supply terminal of the first power amplifier to provide a second gain level greater than the first gain level in the first power amplifier for amplifying the transmit signal to generate the amplified transmit signal at the first antenna output terminal, and connect the second supply voltage terminal to the supply terminal of the second power amplifier to provide a third gain level greater than the second gain level in the second power amplifier for amplifying the transmit signal to generate the amplified transmit signal at the second antenna output terminal.

2. The transmitter of claim 1, wherein the power supply switch comprises:
a first switch element connected between the first supply voltage terminal and the supply terminal of the first power amplifier;
a second switch element connected between the second supply voltage terminal and the supply terminal of the first power amplifier; and
a third switch element connected between the second supply voltage terminal and the supply terminal of the second power amplifier.

3. The transmitter of claim 2, wherein the control unit is configured to:
close the first switch element to provide a first gain level in the first power amplifier for amplifying the transmit signal to generate the amplified transmit signal at the first antenna output terminal;
close the second switch element to provide a second gain level greater than the first gain level in the first power amplifier for amplifying the transmit signal to generate the amplified transmit signal at the first antenna output terminal; and
close the third switch element to provide a third gain level greater than the second level in the second power amplifier for amplifying the transmit signal to generate the amplified transmit signal at the second antenna output terminal.

4. The transmitter of claim 1, wherein:
the control unit is configured to connect the first supply voltage terminal to the supply terminal of the first power amplifier to provide one of a first gain level or a second gain level greater than the first gain level in the first power amplifier for amplifying the transmit signal to generate the amplified transmit signal at the first antenna output terminal.

5. The transmitter of claim 1, comprising:
a mixer connected to the port; and
an input matching network having a first input connected to the mixer and an output connected to the first power amplifier and the second power amplifier.

6. The transmitter of claim 1, comprising:
a first driver connected to the port; and
an input matching network having a first input connected to the first driver and an output connected to the first power amplifier and the second power amplifier.

7. The transmitter of claim 6, comprising:
a second driver connected to the input matching network; and an interstage matching network having an input connected to the second driver and an output connected to the second power amplifier.

8. The transmitter of claim 1, comprising:

an output matching network connected to at least one of the first power amplifier or the second power amplifier, wherein:

the output matching network is configured to receive a differential input signal and generate the amplified transmit signal as a single-ended output signal.

9. The transmitter of claim 1, wherein the power supply switch comprises:

a first switch connected to the first supply voltage terminal;

a second switch connected to the first switch at a node and connected to the supply terminal of the first power amplifier; and a third switch connected to the first supply voltage terminal and the node, wherein:

the first supply voltage terminal is connected to a body terminal of the first switch;

the second supply voltage terminal is connected to a body terminal of the second switch; and the control unit is configured to close the third switch when the first switch is open and the second switch is closed.

10. The transmitter of claim 9, wherein the power supply switch comprises:

a fourth switch connected to the second supply voltage terminal and the supply terminal of the first power amplifier; and a fifth switch connected to the second supply voltage terminal and the supply terminal of the second power amplifier.

11. A radio, comprising:

an antenna port;

a modulator configured to generate a transmit signal;

a transmit-receive switch connected to the antenna port;

a receiver connected to the transmit-receive switch;

a transmitter connected to the transmit-receive switch and comprising:

a first power amplifier connected to the modulator;

a second power amplifier connected to the modulator;

a power supply switch configured to selectively couple one of a first supply voltage terminal or a second supply voltage terminal to one of a supply terminal of the first power amplifier or a supply terminal of the second power amplifier;

a control unit configured to control the power supply switch based on a transmitter power requirement;

a first antenna output terminal connected to the first power amplifier; and a second antenna output terminal connected to the second power amplifier; and a processor configured to control the transmit-receive switch to toggle between a transmit mode, wherein the transmitter is connected to the antenna port, and a receive mode, wherein the receiver is connected to the antenna port, wherein the control unit is configured to control the power supply switch to connect the first supply voltage terminal to the supply terminal of the first power amplifier to provide a first gain level in the first power amplifier for amplifying the transmit signal to generate an amplified transmit signal at the first antenna output terminal, connect the second supply voltage terminal to the supply terminal of the first power amplifier to provide a second gain level greater than the first gain level in the first power amplifier for amplifying the transmit signal to generate the amplified transmit signal at the first antenna output terminal, and connect the second supply voltage terminal to the supply terminal of the second power amplifier to provide a third gain level greater than the second gain level in the second power amplifier for amplifying the transmit signal to generate the amplified transmit signal at the second antenna output terminal.

12. The radio of claim 11, wherein the power supply switch comprises:

a first switch element connected between the first supply voltage terminal and the supply terminal of the first power amplifier;

a second switch element connected between the second supply voltage terminal and the supply terminal of the first power amplifier; and a third switch element connected between the second supply voltage terminal and the supply terminal of the second power amplifier.

13. The radio of claim 11, wherein:

the control unit is configured to connect the first supply voltage terminal to the supply terminal of the first power amplifier to provide one of a first gain level or a second gain level greater than the first gain level in the first power amplifier for amplifying the transmit signal to generate an amplified transmit signal at the first antenna output terminal.

14. The radio of claim 11, wherein the transmitter comprises:

a mixer connected to the modulator;

a first driver connected to the modulator; and an input matching network having a first input connected to the mixer and the first driver and an output connected to the first power amplifier and the second power amplifier.

15. The radio of claim 11, comprising:

a first driver connected to the modulator;

an input matching network having a first input connected to the first driver and an output connected to the first power amplifier and the second power amplifier;

a second driver connected to the input matching network; and an interstage matching network having an input connected to the second driver and an output connected to the second power amplifier.

16. The radio of claim 11, wherein the power supply switch comprises:

a first switch connected to the first supply voltage terminal;

a second switch connected to the first switch at a node and connected to the supply terminal of the first power amplifier;

a third switch connected to the first supply voltage terminal and the node;

a fourth switch connected to the second supply voltage terminal and the supply terminal of the first power amplifier; and a fifth switch connected to the second supply voltage terminal and the supply terminal of the second power amplifier, wherein:

the first supply voltage terminal is connected to a body terminal of the first switch;

the second supply voltage terminal is connected to a body terminal of the second switch; and the control unit is configured to close the third switch when the first switch is open and the second switch is closed.

17. A method, comprising:

based on a first power requirement of a transmitter, controlling a power supply switch to connect a first supply voltage terminal of the transmitter to a supply terminal of a first power amplifier to provide a first gain level in the first power amplifier for amplifying a transmit signal to generate an amplified transmit signal at a first antenna output terminal;

based on a second power requirement of the transmitter, controlling the power supply switch to connect a second supply voltage terminal of the transmitter to the supply terminal of the first power amplifier to provide a second gain level greater than the first gain level in the first power amplifier for amplifying the transmit signal to generate the amplified transmit signal at the first antenna output terminal; and based on a third power requirement of the transmitter, controlling the power supply switch to connect the second supply voltage terminal to a supply terminal of a second power amplifier to provide a third gain level greater than the second gain level in the second power amplifier for amplifying the transmit signal to generate the amplified transmit signal at a second antenna output terminal.

18. The method of claim 17, comprising:

providing a fourth gain level greater than the first gain level and less than the second gain level in the first power amplifier for amplifying the transmit signal to generate the amplified transmit signal at the first antenna output terminal.

* * * * *